US006548361B1

United States Patent
En et al.

(10) Patent No.: US 6,548,361 B1
(45) Date of Patent: Apr. 15, 2003

(54) SOI MOSFET AND METHOD OF FABRICATION

(75) Inventors: William G. En, Milpitas, CA (US);
Dong-Hyuk Ju, Cupertino, CA (US);
Srinath Krishnan, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/145,915

(22) Filed: May 15, 2002

(51) Int. Cl.[7] ............................................. H01L 21/336
(52) U.S. Cl. ........................ 438/301; 438/303; 438/305
(58) Field of Search .................................. 438/155, 162, 438/166, 384, 297, 295, 298, 517, 410, 301, 303, 305, 231, 230, 595; 257/65, 369, 903

(56) References Cited

U.S. PATENT DOCUMENTS

| 5,801,396 A | * | 9/1998 | Chan et al. | 257/369 |
| 5,825,066 A | * | 10/1998 | Buynoski | 257/344 |
| 5,858,843 A | * | 1/1999 | Doyle et al. | 438/299 |
| 5,863,823 A | * | 1/1999 | Burgener | 438/295 |
| 5,973,363 A | * | 10/1999 | Staab et al. | 257/288 |
| 6,090,648 A | * | 7/2000 | Reedy et al. | 438/155 |
| 6,184,097 B1 | * | 2/2001 | Yu | 438/299 |
| 6,225,176 B1 | * | 5/2001 | Yu | 438/305 |
| 6,284,672 B1 | | 9/2001 | Yu | |
| 6,297,115 B1 | | 10/2001 | Yu | |
| 6,365,472 B1 | * | 4/2002 | Ishimaru et al. | 438/301 |
| 6,372,591 B1 | * | 4/2002 | Mineji et al. | 438/305 |

OTHER PUBLICATIONS

*Parasitic Bipolar Gain Reduction and the Optimization of 0.25 –μm Partially Depleted SOI MOSFET's*, Mistry, et al., IEEE Transactions on Electron Devices, vol. 46, No. 11, Nov. 1999.

* cited by examiner

*Primary Examiner*—Carl Whitehead, Jr.
*Assistant Examiner*—Laura M Schillinger
(74) *Attorney, Agent, or Firm*—Renner, Otto, Boiselle & Sklar, LLP

(57) ABSTRACT

A MOSFET formed in semiconductor-on-insulator format. The MOSFET includes a source and a drain formed in a layer of semiconductor material, each having an extension region and a deep doped region. A body is formed between the source and the drain and includes a first damaged region adjacent the extension of the source and a second damaged region adjacent the extension of the drain. The first and second damaged regions include defects caused by amorphization of the layer of semiconductor material. A gate electrode, the source, the drain and the body are operatively arranged to form a transistor.

14 Claims, 2 Drawing Sheets

SOI MOSFET AND METHOD OF FABRICATION

TECHNICAL FIELD

The present invention relates generally to semiconductor devices and the abrication thereof and, more particularly, to an semiconductor-on-insulator (SOI) MOSFET having damaged regions to enhance device performance and a method of abrication.

BACKGROUND

A pervasive trend in modern integrated circuit manufacture is to produce semiconductor devices, such as metal oxide semiconductor field effect transistors (MOSFETs), that are as small as possible. In a typical MOSFET, a source and a drain are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer.

The fabrication of smaller transistors allows more transistors to be placed on a single monolithic substrate for the formation of relatively large circuit systems in a relatively small die area. Also, SOI wafers offer potential advantages over bulk wafers for the fabrication of high performance integrated circuits. Dielectric isolation and reduction of parasitic capacitance improve circuit performance, and virtually eliminate latch-up in CMOS circuits. In addition, circuit layout in SOI can be greatly simplified and packing density greatly increased if the devices are made without body contacts (i.e., if the body regions of these devices are "floating").

However, MOSFETs formed from SOI materials can exhibit parasitic effects due to the presence of the floating body ("floating body effects"). These floating body effects may result in undesirable performance in SOI devices.

In addition, device downscaling can result in a number of performance degrading effects. In FET devices with a channel having a relatively short length, the FET can experience a number of undesirable electrical characteristics referred as short channel effects (SCE). SCE generally occur when the gate does not have adequate control over the channel region, and can include threshold voltage ($V_t$) roll-off, off current (Ioff) roll-up and drain induced barrier lowering (DIBL). As the physical dimensions decrease, SCE can become more severe. SCE is the result of intrinsic properties of the crystalline materials used in the FET devices. Namely, the band gap and built-in potential at the source/body and drain/body junctions are non-scalable with the reduction of physical device dimensions, such as a reduction in channel length.

Accordingly, there exists a need in the art for semiconductor devices, such as MOSFETs, that optimize scale and performance. There also exists a need for corresponding fabrication techniques to make those semiconductor devices.

SUMMARY OF THE INVENTION

According to one aspect of the present invention, the invention is directed to a MOSFET formed in semiconductor-on-insulator format. The MOSFET includes a source and a drain formed in a layer of semiconductor material, each of the source and the drain including an extension region and a deep doped region. A body is formed between the source and the drain and includes a first damaged region adjacent the extension of the source and a second damaged region adjacent the extension of the drain. The first and second damaged regions include defects caused by amorphization of the layer of semiconductor material. A gate electrode is disposed over the body region and is separated from the layer of semiconductor material by a gate dielectric. The gate electrode, the source, the drain and the body are operatively arranged to form a transistor.

According to another aspect of the invention, the invention is directed to a method of making a MOSFET in semiconductor-on-insulator format. The method includes providing a semiconductor-on-insulator wafer having a layer of semiconductor material disposed on an insulating layer, the insulating layer disposed on a substrate; forming a gate electrode over the layer of semiconductor material and separated from the layer of semiconductor material by a gate dielectric; implanting amorphizing ion species into the layer of semiconductor material to form a source side amorphous region and a drain side amorphous region, the amorphous regions having a depth that is less than a thickness of the layer of semiconductor material; forming an offset spacer adjacent each lateral sidewall of the gate electrode; implanting dopant ion species into the layer of semiconductor material to form a source side extension and a drain side extension, the extensions having a depth that is less than the depth of the amorphous regions; forming a sidewall spacer adjacent each offset spacer; and implanting dopant ion species into the layer of semiconductor material to form a source side deep doped region and a drain side deep doped region.

BRIEF DESCRIPTION OF DRAWINGS

These and further features of the present invention will be apparent with reference to the following description and drawings, wherein.

DISCLOSURE OF INVENTION

Figure 1:
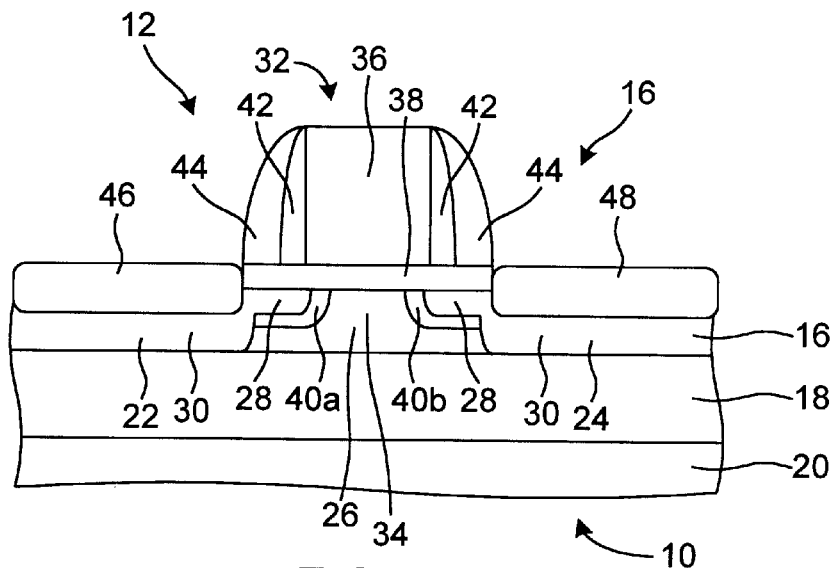
FIG. 1 is a schematic block diagram of an exemplary MOSFET formed in accordance with the present invention.

In the detailed description that follows, corresponding components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, a wafer 10 having a metal oxide semiconductor field effect transistor (MOSFET) 12 formed in accordance with an example embodiment of the present invention is illustrated. The illustrated MOSFET 12 can be used, for example, in the construction of a complimentary metal oxide semiconductor (CMOS) integrated circuit. Although only one MOSFET 12 is illustrated, one skilled in the art will appreciate that the illustrated device is merely exemplary and that multiple MOSFETs 12, including N-channel and/or P-channel devices, can be formed on the wafer 10. As one skilled in the art will appreciate, the structures and the techniques for fabricating the MOSFET 12 described herein can be used for other types of semiconductors (e.g., other types of transistors, memory cells, etc.)

and the illustrated MOSFET 12 is merely exemplary. Multiple semiconductor devices formed on the wafer 10 can be separated by isolation regions (not shown), such as shallow trench isolation (STI) regions, as is well known in the art.

The MOSFET 12 is formed using an active region 14 formed in a layer of semiconductor material 16. In the illustrated example of FIG. 1, the layer of semiconductor material 16 is a semiconductor film (for example, comprised of silicon, silicon-germanium, or the like) formed on a layer of insulating material 18 (for example, a buried oxide (BOX) layer). The insulating layer 18 is, in turn, formed on a semiconductor substrate 20 (also referred to in the art as a handle wafer) so that devices formed on the wafer 10 are formed in a semiconductor-on-insulator (SOI) format. Alternatively, the layer of semiconductor material 16 could be a semiconductor substrate used for the formation of "bulk" type devices.

The active region 14 includes a source 22, a drain 24 and a body 26 disposed between the source 22 and the drain 24. The source 22 and the drain 24 can be formed by implanting ion species as will be described in greater detail below. In addition, the source 22 and the drain 24 can each be provided with an extension region 28 and a deep doped region 30 as is known in the art.

A gate 32 is disposed on the layer of semiconductor material 16 over the body 26 and defines a channel 34 within the body 26 (the channel 34 being interposed between the source 22 and the drain 24 and controlled by a work function of the gate 32). The gate 32 includes a gate electrode 36 spaced apart from the layer of semiconductor material 16 by a gate dielectric 38. In one embodiment, the gate electrode 36 can be made from a semiconductor (e.g., polycrystalline silicon, polycrystalline silicon-germanium, etc.). Alternatively, a metal (e.g., tungsten, tantalum, aluminum, nickel, ruthenium, rhodium, palladium, platinum, titanium, molybdenum, etc.) or a metal containing compound (e.g., titanium nitride, tantalum nitride, etc.) could also be used for the gate electrode 36.

In one embodiment, the gate dielectric 38 can be made from a standard-K material. As used herein, the term "standard-K dielectric" or "standard-K dielectric material" refers to a dielectric material having a relative permitivity, or K, of up to about ten (10). Relative permitivity is the ratio of the absolute permitivity ($\in$) found by measuring capacitance of the material to the permitivity of free space ($\in_0$), that is K=$\in$/$\in_0$. Example standard-K materials include, for example, silicon dioxide (K of about 3.9), silicon oxynitride (K of about 4 to 8 depending on the relative content of oxygen and nitrogen) and silicon nitride (K of about 6 to 9).

In another embodiment, the gate dielectric 38 can be made from a high-K material or stack of materials to form a high-K dielectric stack. As used herein, a "high-K material" or a "high-K dielectric material" refers to a material, or stack of materials, having a relative permitivity in one embodiment of about ten (10) or more, and in another embodiment of about twenty (20) or more. Although other high-K materials can be selected, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$) and barium strontium titanate (BST) are example suitable materials for the gate dielectric 38. In addition, all binary and ternary metal oxides and ferroelectric materials having a K higher than, in one embodiment, about twenty (20) can be used for the gate dielectric 38. When a high-K material is selected as the gate dielectric 38, the high-K material can have an equivalent oxide thickness (EOT) of about one nanometer (1 nm) or less.

The MOSFET 12 can be provided with damaged regions 40. In the illustrated embodiment, the MOSFET 12 has a source-side damaged region 40*a* and a drain-side damaged region 40*b*. The damaged regions 40 have the same or approximately the doping (e.g., N-type doping, P-type doping or neutral doping) as the body 26 and, therefore, can be considered to be part of the body 26. In the illustrated embodiment, the damaged regions 40 generally form arcuate sections. More particularly, the damaged regions 40 follow a contour of the extension regions 28. For example, the source-side damaged region 40*a* extends downward from the gate dielectric 38 under the gate electrode 36 and along the junction of the source 22 extension region 28 and the body 26, bends outward toward the source 22 and laterally extends to the deep doped region 30 of the source 22. Similarly, the drain-side damaged region 40*b* extends downward from the gate dielectric 38 under the gate electrode 36 and along the junction of the drain 24 extension region 28 and the body 26, bends outward toward the drain 24 and laterally extends to the deep doped region 30 of the drain 24.

The damaged regions 40 are formed by selectively amorphizing the layer of semiconductor material 16 by implanting amorphizing ion species (e.g., xenon, argon, helium, neon, germanium, silicon, etc.) as will be described in greater detail below. Following amorphization, the layer of semiconductor material 16 can be at least partially recrystallized, but imperfections in the layer of semiconductor material 16 caused by the implanted ions will remain. These imperfections located in the vicinity of the damaged regions 40 can assist in enhancing device performance.

Without intending to be bound by theory, the damaged regions 40 can improve control over the floating body (e.g., by reducing floating body effects, or FBE). It is noted that partially depleted devices have greater susceptibility to floating body effects than fully depleted devices. Although the present invention can be applied to both partially depleted and fully depleted devices, the damaged induced in the areas of the extension 30/body 26 junctions enhances leakage. The leakage allows body charge to dissipate, thereby improving floating body control, especially in fully depleted devices.

In addition, the presence of an amorphous region (described in greater detail below) during the implantation of the extensions 28 and subsequent anneal cycle (e.g., a conventional anneal cycle to activate dopant species as described below in greater detail) allows for shallower extension 30/body 26 junctions. In one embodiment, the extensions 28 can be formed with a junction depth of less than about 30 nm (such a junction depth being difficult to obtain with conventional extension processing due to transient enhanced diffusion, or TED). However, the extensions 28 can be implanted to have deeper junction depths if desired for the device being fabricated. Nevertheless, the enhanced control over extension 28 junction depth can assist in reducing short-channel effects (SCE).

The MOSFET 12 can be provided with offset spacers 42 disposed adjacent each sidewall of the gate electrode 36 to assist in formation of the damaged regions 40 as will become more apparent below. Alternatively, the offset spacers 42 could be replaced by a liner. Therefore, the term offset spacer, as used herein, includes liners and any other structures that can be used to laterally offset ion implantation.

The MOSFET 12 can also be provided with sidewall spacers 44 as is known in the art for controlling the implantation of dopant species for formation of the deep doped regions 30 of the source 22 and the drain 24. It is noted that the offset spacers 42 are disposed between the gate electrode 36 and the sidewall spacers 44. In addition, a source contact 46 and a drain contact 48 can be provided. In one embodiment, the source contact 46 and the drain contact 48 are formed by respectively siliciding the source 22 and the drain 24. The MOSFET 12 can also be provided with a gate electrode contact (not shown) used in establishing electrical connection to the gate electrode 36. In embodiments where the gate electrode 36 is made from a semiconductor material, the gate electrode contact can be formed by siliciding the gate electrode 36. In other embodiments (e.g., when a metal gate electrode 36 is used), the gate electrode contact can be made from another material (such as a metal) or omitted. Other components, such as a cap (or passivation) layer (not shown), vias (not shown), and conductor lines (not shown) to interconnect devices formed on the wafer 10, can also be provided.

Figure 2:
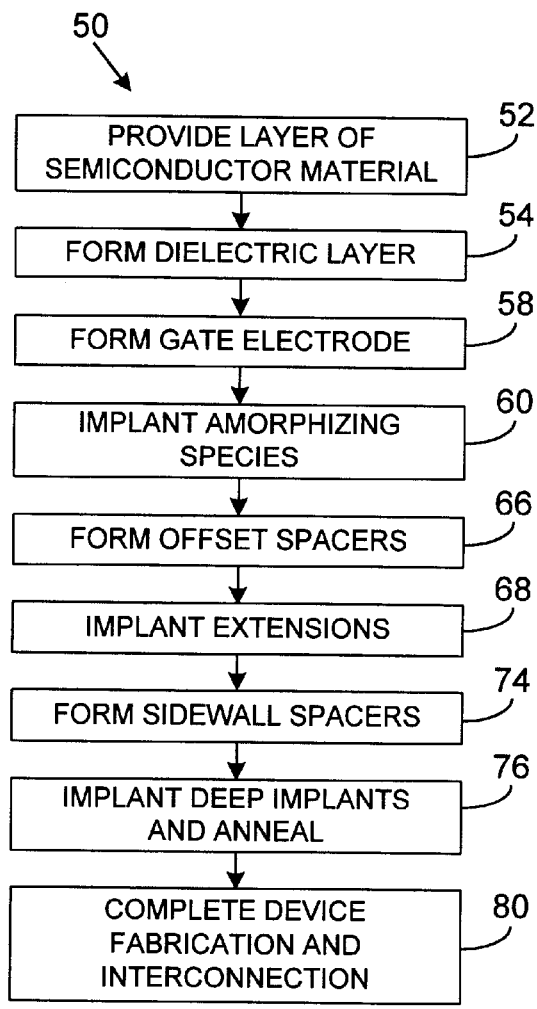
FIG. 2 is a flow chart illustrating an example method of forming the MOSFET of FIG. 1.

Referring now to FIG. 2, an exemplary method 50 of forming the MOSFET 12 is illustrated. With additional reference to FIG. 3A, the method 50 starts in step 52 where the layer of semiconductor material 16 is provided. As indicated above, the layer of semiconductor material 16 can be a semiconductor substrate, such as a silicon substrate. Alternatively, and as illustrated in FIGS. 3A–3D, the layer of semiconductor material 16 can be a semiconductor film (such as a silicon film or a silicon-germanium film) formed on the insulating layer 18 (such as a BOX layer). In one embodiment, the semiconductor film is about 100 Å to about 2,000 Å thick. The insulating layer 18 can be formed on the semiconductor substrate 20 (such as a silicon substrate) so as to form an SOI substrate stack. If appropriate, the layer of semiconductor material 16 can be doped with N-type and/or P-type dopant for use in the formation of N-type body regions and/or P-type body regions. Alternatively, the layer of semiconductor material 16 can be left undoped for the formation of undoped body regions. If desired, isolation regions (not shown) can be formed. The isolation regions can be used define the size and placement of the active region 14 (FIG. 1) and to isolate adjacent semiconductor devices formed on the wafer 10. The formation of isolation regions is well known in the art (e.g., by conventional a shallow trench isolation (STI) formation technique) and will not be described in greater detail.

Next, in step 54, a layer of dielectric material 56 is formed over the layer of semiconductor material 16. The layer of dielectric material 56 is used to form the gate dielectric 38. In an embodiment where a high-K material is selected for the layer of dielectric material 56 (hence the gate dielectric 38 will be composed of high-K material), a buffer interface material layer (not shown) can be formed between the layer of semiconductor material 16 and the layer of dielectric material 56. For example, the buffer interface layer can be a thin layer of oxide (e.g., silicon oxide that is about 0.5 nm to about 0.7 nm thick). The buffer interface layer can be formed by a low temperature (about 500° C.) thermal oxidation process, a remote plasma deposition process, an atomic layer deposition (ALD) process or the like. The buffer interface layer assists in reducing integration issues that may arise when attempting form a layer of high-K material on a semiconductor layer. Therefore, if the gate dielectric is formed from a standard-K material or if the buffer interface layer is not desired, formation of the buffer interface layer can be omitted.

Thereafter, in step 58, a layer of material used to form the gate electrode 36 is grown or deposited over the layer of dielectric material 56. The gate electrode material can be, for example, a doped semiconductor (e.g., polycrystalline silicon, polycrystalline silicon-germanium, etc.). Alternatively, the gate electrode material can be composed of a metal (e.g., tungsten, tantalum, aluminum, nickel, ruthenium, rhodium, palladium, platinum, titanium, molybdenum, etc.) or a metal containing compound (e.g., titanium nitride, tantalum nitride, ruthenium oxide, etc.). The gate electrode material can be selected or doped for N-channel devices (e.g., tungsten, tantalum, aluminum, titanium nitride, tantalum nitride, or N+ polysilicon) or for P-channel devices (e.g., tungsten, nickel, ruthenium, rhodium, palladium, platinum, titanium nitride, tantalum nitride, ruthenium oxide or P+ polysilicon).

After the layer of material used to form the gate electrode 36 is formed and doped (if appropriate), the gate electrode 36 can be patterned. Techniques for patterning the gate electrode 36 will be known to those skilled in the art and will not be described in detail herein. It is noted, however, that the layer of dielectric material 56 used to form the gate dielectric 38 can also be patterned so as to be coextensive with the gate electrode 36. Alternatively, and as illustrated, the layer of dielectric material 56 can be patterned at a subsequent point in the method 50 such that the layer of dielectric material 56 functions as an implant screen for the implantation of ion species as described below.

Figure 3A:
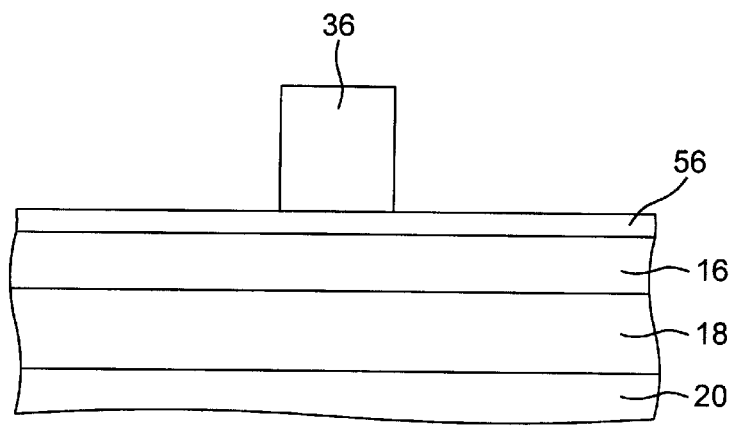
FIGS. 3A through 3D illustrate the MOSFET of FIG. 1 in various stages of manufacture.
Figure 3B:
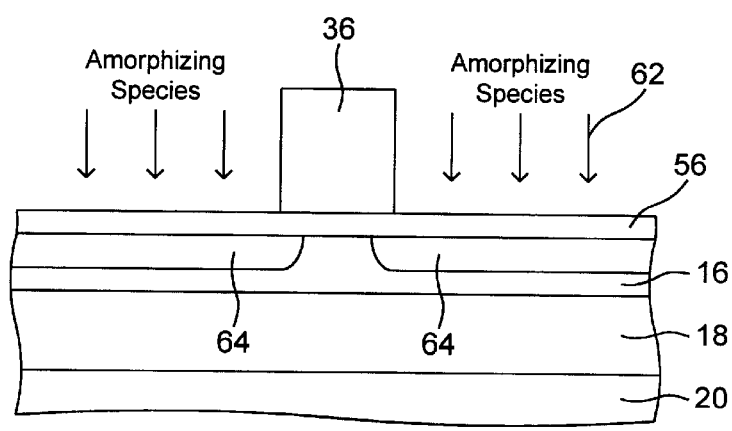

With additional reference to FIG. 3B, the method 50 can continue in step 60 where amorphizing ion species 62 can be implanted to amorphize a portion of the layer of the semiconductor material 16, thereby forming amorphized areas (or amorphous regions) 64. The amorphizing species 62 can include, for example, xenon, argon, helium, neon, germanium and silicon. The amorphizing species 62 can be implanted to amorphize an upper portion of the layer of semiconductor material 16 (that is, the amorphizing species 62 are not implanted down to the isolating layer 18). Although the gate electrode 36 will act as a self aligned mask to block ion implantation under the gate electrode, some amorphizing ions will tend to diffuse under the gate electrode 36 and amorphize a portion of the layer of semiconductor material 16 that will ultimately become the body 26 (FIG. 1). The depth of amorphization and the distance to which amorphizing ions diffuse under the gate (if diffusion occurs) will depend on the type of ion species, the energy of implantation and the dose. The energy and dose can be calculated empirically for the ion species selected an the specific semiconductor device being fabricated. In one example embodiment, xenon is selected as the amorphizing species and is implanted with an energy of about 10 keV to about 90 keV with a dose of about $5e^{13}$ to about $3e^{14}$, resulting in an implantation depth of about 50 Å to about 800 Å.

Figure 3C:
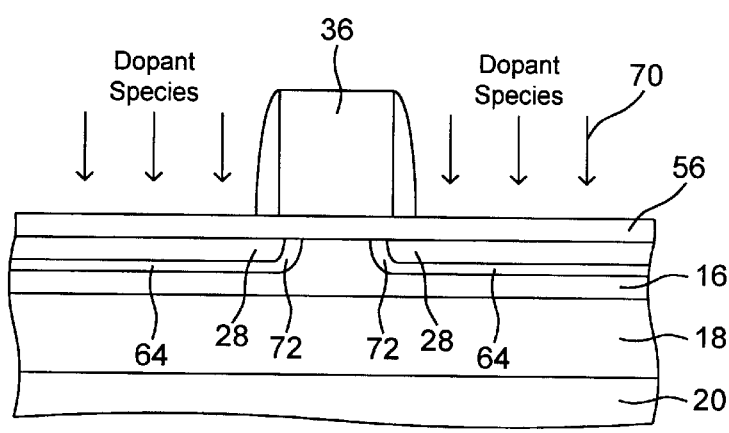

With additional reference to FIG. 3C, the method 50 can continue in step 66 where the offset spacers 42 are formed. The offset spacers 42 can be formed in similar fashion to the formation of conventional sidewall spacers. For example, a layer of desired material (e.g., silicon oxide, silicon nitride, silicon oxynitride, etc.) can be deposited to at least the height of the gate electrode 36. The deposited material is then polished (using, for example, chemical mechanical planarization, or CMP) back to an upper surface of the gate electrode 36 and then anisotropically etched back to the underlying layer (e.g., the layer of dielectric material 56 or, if exposed, the layer of semiconductor material 16). In one embodiment, the offset spacers 42 can have a width of about 50 Å to about 700 Å. In an alternative embodiment, a liner (e.g., a conformal layer formed over the gate electrode 36) can be substituted for the offset spacers 42 or used in addition to the offset spacers 42.

Next, in step 68, the extensions 28 can be implanted. The formation of shallow source 22 and drain 24 extensions 28, such as by using a lightly doped drain (LDD) technique, is well known in the art and will not be described in detail herein. Briefly, for a P-type extension region, ions 70 such as boron, gallium or indium can be implanted. For an N-type extension region, ions 70 such as antimony, phosphorous or arsenic can be implanted. The energy and dosage of the ion species can be determined empirically for the device being fabricated. The extensions 38 may diffuse under the offset spacers 42 and possibly under gate electrode 36. The extent of diffusion and the depth of implantation will depend on the ion species 70 selected, the energy of implantation and the dose.

The extensions 28 are implanted to have a depth that is less than the depth of the amorphized regions 64. In addition, the extensions are implanted such that the amorphized regions 64 extend laterally inward from the inward lateral edges extensions 28 (i.e., the extension 28/body 26 junctions). As a result, and as best illustrated in FIG. 3C, arcuate segments 72 of the amorphized regions 64 receive no or substantially no doping from the extension implantation step 68.

Figure 3D:
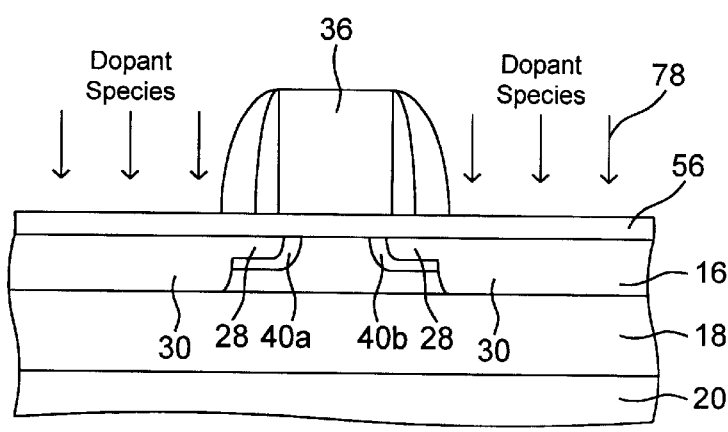

Thereafter, in step 74 and with additional reference to FIG. 3D, the sidewall spacers 44 can be formed adjacent the offset spacers 42. The sidewall spacers 44 can be formed using conventional techniques. For example, the sidewall spacers 44 can be formed by depositing a layer of desired material (e.g., silicon oxide, silicon nitride, silicon oxynitride, etc.), polishing the deposited layer and anisotropically etching back the sidewall spacer 44 material to the underlying layer (e.g., the layer of dielectric material 56 or, if exposed, the layer of semiconductor material 16).

Next, in step 76, the deep doped regions 30 of the source 22 and the drain 24 can be formed. The sidewall spacers 42, the offset spacers 44 and the gate electrode 36 act as a self-aligned mask for the implantation of the deep doped regions 30. Implanting dopant species 78 to form the deep doped regions 30 of the source 22 and the drain 24 is well known in the art and will not be described in great detail herein. Briefly, to form a P-type deep doped region 30, ions 78 such as boron, allium or indium can be implanted. N-type deep doped regions 30 can be formed by implanting ions 78 such as antimony, phosphorous or arsenic. The energy and dosage of the ion species 78 can be determined empirically for the device being fabricated. The implanted ions 78 may laterally diffuse slightly under the sidewall spacers 44 as is conventional.

Following implantation of the deep doped regions 30, an anneal cycle can be carried out to activate the dopant species 70 and 78. Annealing of the wafer 10 (such as by rapid temperature annealing (RTA), laser annealing and so forth) is well known in the art and will not be described in great detail.

It is noted that the anneal cycle can also be used to recrystallize the amorphized areas 64 of the layer of semiconductor material 16. Accordingly, the anneal temperature should be higher than the transformation temperature of the layer of semiconductor material (e.g., about 600° C. for silicon). The unamorphized portions of the layer of semiconductor material 16 can act as a seed crystal for the recrystallization of the amorphized regions 64. Even though the amorphized regions can be recrystallized, imperfects and defects will remain in the originally amorphized regions 64, resulting in the damaged regions 40. Although not shown, it is noted that some imperfections may also remain in the source 22 and the drain 24. In an alternative embodiment, separate anneal cycles to activate the dopant species and to recrystallize the layer of semiconductor material 16 can be carried out.

As one skilled in the art will appreciate, the amorphizing implant, the offset spacers 42, the extension 28 implantation, the sidewall spacers 44 and the deep implants 30 can all be controlled (e.g., in terms of lateral width for the spacers 42 and 44 and in term of species type, dose and energy for the implantations) to arrive at the desired configuration of the damaged regions 40. In addition, the anneal cycle can be controlled to regulate the amount of residual damage left by the amorphous areas 64.

Next, with reference back to FIG. 1, the method 50 can continue in step 80 where any additional processing to complete the formation of the MOSFET 12 and to interconnect devices formed on the wafer 10 can be carried out. Such additional processing can include opening the source 22 and the drain 24 (e.g., by removing portions of the layer of dielectric material 56 that laterally extend beyond the sidewall spacers 44). Thereafter, the source contact 46, the drain contact 48 and the gate electrode contact (not shown) can be formed. In the illustrated embodiment, the source contact 46 and the drain contact 48 are formed from a silicide. Briefly, the silicide can be formed by depositing a layer of metal (such as cobalt, nickel, molybdenum or titanium) and reacting the metal with the layer of semiconductor material 16. Step 78 can also include processing to form, for example, a cap layer (or passivation layer), contact holes or vias, conductor runs and so forth.

Although particular embodiments of the invention have been described in detail, it is understood that the invention is not limited correspondingly in scope, but includes all changes, modifications and equivalents coming within the spirit and terms of the claims appended hereto.

What is claimed is:

1. a MOSFET formed in semiconductor-on-insulator format, comprising:
    a layer of semiconductor material disposed on an insulating layer, the insulating layer disposed on a substrate;
    a source and a drain formed in the layer of semiconductor material, each of the source and the drain including an extention region a deep doped region;
    a body formed in the layer of semiconductor material and between the source and the drain, the body including a first damaged region disposed adjacent and laterally inward from the extention of the source and a second damaged region disposed adjacent and laterally inward from the extention of the drain, the first and second damaged region including defects caused by amorphization of the layer of semiconductor material; and
    a gate electrode disposed over the body region and separated from the layer of semiconductor material by a gate dielectric, the gate electrode, the source, the drain and the body operatively arranged to from a transistor.

2. The MOSFET according to claim 1, wherein the damaged regions are respectively part of a first and a second recrystallized amorphous region, the recrystallized amorphous regions formed by implanting amorphizing ion species and subsequent annealing.

3. The MOSFET according to claim 2, wherein the first recrystallized amorphous region extends into the source and the second recrystallized amorphous region extends into the drain.

4. The MOSFET according to claim 2, wherein the amorphous regions assist in controlling extension junction depth.

5. The MOSFET according to claim 2, wherein the amorphous regions have a depth of about 50 Å to about 800 Å.

6. The MOSFET according to claim 5, wherein the extensions have a junction depth of less than about 30 nm.

7. The MOSFET according to claim 1, wherein the extensions have a junction depth of less than about 30 nm.

8. The MOSFET according to claim 1, wherein the damaged regions have a depth that is less than a thickness of the layer of semiconductor material and the extensions have a depth that is less than the depth of the damaged regions.

9. The MOSFET according to claim 1, wherein the gate dielectric is composed of a high-K material.

10. The MOSFET according to claim 1, further comprising:
   an offset spacer disposed adjacent each lateral sidewall of the gate electrode, the offset spacers controlling the implantation of ions for the extensions; and
   a sidewall spacer disposed adjacent each offset spacer, the sidewall spacers controlling the implantation of ions for the drain deep doped regions.

11. A MOSFET formed in semiconductor-on-insulator format, comprising:
   a layer of semiconductor material disposed on an insulating layer, the insulating layer disposed on a substrate;
   a source and a drain formed in the layer of semiconductor material, each of the source and the drain including an extension region and a deep doped region;
   a body formed in the layer of semiconductor material and between the source and the drain, the body including a first damaged region adjacent the extension of the source and a second damaged region adjacent the extension of the drain, wherein the damaged regions respectively conform to a source side extension/body junction and a drain side extension/body junction; and
   a gate electrode disposed over the body region and separated from the layer of semiconductor material by a gate dielectric, the gate electrode, the source, the drain and the body operatively arranged to form a transistor.

12. The MOSFET according to claim 11, wherein the damaged regions are respectively part of a first and a second recrystallized amorphous region, the recrystallized amorphous regions formed by implanting amorphizing ion species and subsequent annealing.

13. The MOSFET according to claim 12, wherein the amorphous regions have a depth of about 50 Å to about 800 Å.

14. The MOSFET according to claim 13, wherein the extensions have a junction depth of less than about 30 nm.

* * * * *

UNITED STATES PATENT AND TRADEMARK OFFICE
CERTIFICATE OF CORRECTION

PATENT NO.    : 6,548,361 B1
DATED         : April 15, 2003
INVENTOR(S)   : En et al.

It is certified that error appears in the above-identified patent and that said Letters Patent is hereby corrected as shown below:

Column 1,
Line 8, replace "ABRICATION" with -- FABRICATION --
Line 43, replace "REFERRED AS" with -- REFERRED TO AS --

Column 8,
Lines 45, 49, 51 and 52 replace "EXTENTION" with -- EXTENSION --
Line 57, replace "FROM" with -- FORM --

Signed and Sealed this

Twenty-fourth Day of June, 2003

JAMES E. ROGAN
*Director of the United States Patent and Trademark Office*